(12) United States Patent
Boyd et al.

(10) Patent No.: US 6,440,808 B1
(45) Date of Patent: Aug. 27, 2002

(54) DAMASCENE-GATE PROCESS FOR THE FABRICATION OF MOSFET DEVICES WITH MINIMUM POLY-GATE DEPLETION, SILICIDED SOURCE AND DRAIN JUNCTIONS, AND LOW SHEET RESISTANCE GATE-POLY

(75) Inventors: Diane Catherine Boyd, Lagrangeville, NY (US); Stephen Bruce Brodsky, Wappingers Falls, NY (US); Hussein Ibrahim Hanafi, Basking Ridge, NJ (US); Ronnen Andrew Roy, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 09/672,185

(22) Filed: Sep. 28, 2000

(51) Int. Cl.[7] ............................................. H01L 21/336
(52) U.S. Cl. ...................... 438/305; 438/303; 438/592; 438/926
(58) Field of Search ............................... 438/296, 301, 438/303, 305, 592, 926

(56) References Cited

U.S. PATENT DOCUMENTS

| | | | | |
|---|---|---|---|---|
| 6,271,094 B1 | * | 8/2001 | Boyd et al. .................. | 438/287 |
| 6,277,707 B1 | * | 8/2001 | Lee et al. .................... | 438/270 |
| 6,284,613 B1 | * | 9/2001 | Subrahmanyam et al. .. | 438/299 |
| 6,303,418 B1 | * | 10/2001 | Cha et al. .................... | 438/199 |
| 6,303,447 B1 | * | 10/2001 | Chhagan et al. ............ | 438/199 |
| 6,319,807 B1 | * | 11/2001 | Yeh et al. .................... | 438/289 |
| 6,323,112 B1 | * | 11/2001 | Lou ........................... | 438/296 |
| 6,399,432 B1 | * | 6/2002 | Zheng et al. ................ | 438/223 |

* cited by examiner

Primary Examiner—John F. Niebling
Assistant Examiner—Stacy Whitemore
(74) Attorney, Agent, or Firm—Scully, Scott, Murphy & Presser; Manny W. Schecter

(57) ABSTRACT

A sub-0.1 μm MOSFET device having minimum poly depletion, salicided source and drain junctions and very low sheet resistance poly-gates is provided utilizing a damascene-gate process wherein the source and drain implantation activation annealing and silicidation occurs in the presence of a dummy gate region which is thereafter removed and replaced with a polysilicon gate region.

20 Claims, 5 Drawing Sheets

DAMASCENE-GATE PROCESS FOR THE FABRICATION OF MOSFET DEVICES WITH MINIMUM POLY-GATE DEPLETION, SILICIDED SOURCE AND DRAIN JUNCTIONS, AND LOW SHEET RESISTANCE GATE-POLY

FIELD OF THE INVENTION

The present invention relates to semiconductor processing, and more particular to a process for fabricating a high-performance sub-0.1 µm metal oxide semiconductor field effect transistor (MOSFET) device having minimum polysilicon-, i.e., poly-, depletion, silicided source and drain junctions and very low sheet resistance (on the order of 5 ohm/sq. or less) poly-gates.

BACKGROUND OF THE INVENTION

In conventional complementary metal oxide semiconductor (CMOS) processes, the MOSFET's source, drain and gate regions are implanted simultaneously, activated annealed and thereafter silicided so as to produce low junction regions in the substrate and poly-gate lines with low sheet resistance.

For high-performance sub-0.1 µm CMOS devices, these conventional CMOS processes result in the following two problems. The first problem is caused by the simultaneous implantation of the source, drain and gate regions. To guarantee shallow source and drain junctions after annealing, low-implant doses (on the order of $2E15/cm^2$ or less) are typically used. These low-implant doses however are not sufficient to prevent poly-gate depletion which, if not prevented, causes low device transconductance and reduced device performance.

The second problem with the prior art CMOS processes mentioned above is caused by the mere process of siliciding the poly-gate. For poly-gates having a width of 0.25 µm or less, nucleation limited growth of the silicided polysilicon, e.g., TiSi, results in very high sheet resistance which causes an even further reduction in device performance.

In view of the drawbacks mentioned above concerning conventional CMOS processing of high performance sub-0.1 µm CMOS devices, there is a continued need for developing a new and improved process which enables the fabrication of high performance sub-0.1 µm CMOS devices without those devices exhibiting poly-gate depletion and high sheet resistance.

SUMMARY OF THE INVENTION

One object of the present invention is to provide a process which enables the decoupling of the gate implantation and activation annealing from the source and drain implantation and activation annealing.

Another object of the present invention is to provide a process which provides for a very low poly-gate sheet resistance that is independent of the silicidation process of the source and drain regions.

These and other objects and advantages can be achieved in the present invention by utilizing a damascene-gate processing technique which includes the use of a dummy gate region which is present during implanting, activation annealing and siliciding the source and drain regions, the subsequent removal of the dummy gate region and the formation of a metal- or poly-gate region in the region previously occupied by the dummy gate.

Specifically, the process of the present invention comprises the steps of:

(a) providing a dummy gate region on a surface of a substrate, said dummy gate region including polysilicon sandwiched between a bottom oxide layer and a top oxide layer;

(b) forming activated source and drain regions in said substrate using said dummy gate region as an implantation mask;

(c) siliciding the surface of said substrate overlying said activated source and drain regions;

(d) forming an insulator layer on said surface of said substrate, said insulator layer also surrounding said dummy gate region;

(e) planarizing said insulator layer so as to remove said top oxide layer of said dummy gate region thus exposing said polysilicon;

(f) selectively removing said polysilicon and said bottom oxide layer of said dummy gate region so as to provide an opening which exposes a portion of said substrate;

(g) forming a gate dielectric on said exposed portion of said substrate;

(h) depositing a gate conductor on said gate dielectric; and (i) etching said insulator layer formed in step (d).

In one embodiment of the present invention, a recessed polysilicon layer is formed on the gate dielectric prior to conducting steps (h) and (i). The polysilicon of the recessed polysilicon layer may be formed by an in-situ doping deposition process or, alternatively, the polysilicon may be intrinsic polysilicon that is doped by subsequent ion implantation and annealing. The in-situ doping process is employed when a high temperature sensitive gate dielectric is employed, whereas ion implantation and annealing are employed when the gate dielectric consists of a material that can withstand high temperature annealing. It should be noted that when ion implantation and annealing are employed, no silicide agglomerization occurs since the silicide region is protected by the insulator layer that is deposited thereon prior to ion implantation and annealing.

In another embodiment of the present invention, an optional liner is formed on the gate dielectric and on exposed sidewalls of the opening prior to depositing the gate conductor.

In yet another embodiment, heavily N+ doped polysilicon is used as the dummy gate. This embodiment of the present invention enables the dummy gate to be wet etched.

DETAILED DESCRIPTION OF THE DRAWINGS

DETAILED DESCRIPTION OF THE INVENTION

Figure 1:
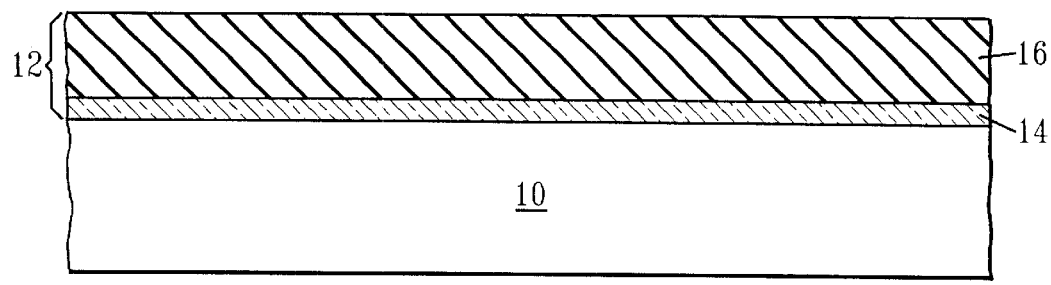
FIGS. 1–12 are pictorial representations of a high-performance sub-0.1 µm MOSFET device through various processing steps of the present invention.

The present invention which provides a process for fabricating high-performance sub-0.1 µm MOSFET devices having minimum poly depletion, silicided source and drain junctions and very low sheet resistance poly-gates will now be described in more detail by referring to the drawings that accompany the present application. It should be noted that in the accompanying drawings like reference numerals are used for describing like and corresponding elements.

Reference is first made to FIG. 1 which illustrates an initial structure that is used in the present invention.

Specifically, the initial structure shown in FIG. 1 comprises substrate 10 and film stack 12. The film stack includes a sacrificial pad oxide layer 14 such as $SiO_2$ which is formed on the surface of substrate 10 and a nitride layer 16 such as $Si_3N_4$ that is formed on the pad oxide layer. Although the drawings of the present invention depict a film stack comprising two material layers, the film stack may also comprise additional material layers.

Pad oxide layer 14 is formed on the surface of substrate 10 using a conventional thermal growing process, or alternatively, the pad oxide layer may be formed by a conventional deposition process such as, but not limited to: chemical vapor deposition (CVD), plasma-assisted CVD, sputtering, evaporation and other like deposition processes. The thickness of the pad oxide layer may vary, but typically, the pad oxide layer has a thickness of from about 8 to about 20 nm.

Insofar as nitride layer 16 is concerned, that layer is formed on the surface of pad oxide layer 14 utilizing conventional deposition processes well known in the art, including the same as mentioned hereinabove in forming the pad oxide layer. The thickness of the nitride layer may vary, but it should be thicker than the pad oxide in which it is formed thereon. Typically, in the present invention, nitride layer 16 of film stack 12 has a thickness of from about 50 to about 200 nm.

The substrate employed in the present invention may be any conventional semiconductor substrate in which a semiconducting material such as silicon is present therein. Examples of some substrates that may be employed in the present invention include, but are not limited to: Si, Ge, SiGe, GaP, InAs, InP and all other III/V compound semiconductors. The substrate may also be composed of a layered semiconductor such as Si/SiGe or Silicon-on-insulators (SOI). The substrate may be of the n-type or p-type depending on the desired device to be fabricated.

Figure 2:
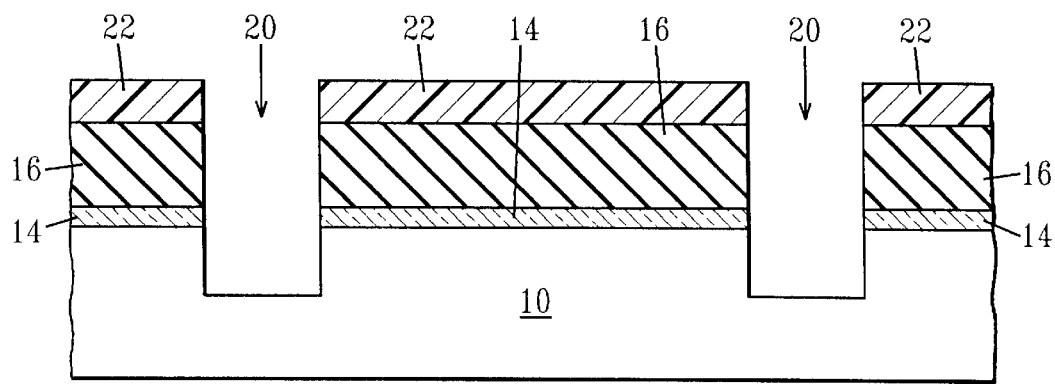

FIGS. 2–5 illustrate processing steps that are used in forming isolation trenches in the substrate. Specifically, FIG. 2 shows the steps of forming isolation trench openings 20 in the structure of FIG. 1. The isolation trench openings are formed by first applying a conventional resist 22 to the exposed surface of nitride layer 16. Lithography (i.e., resist exposure and development) is then performed on the resist so as to provide a pattern. The resist pattern is then transferred to the structure of FIG. 1 by etching through nitride layer 16, pad oxide 14 and a portion of substrate 10 so as to provide the structure shown in FIG. 2. Although the drawings depict the presence of only two isolation trenches, any number of isolation trenches may be formed in the substrate.

Figure 3:
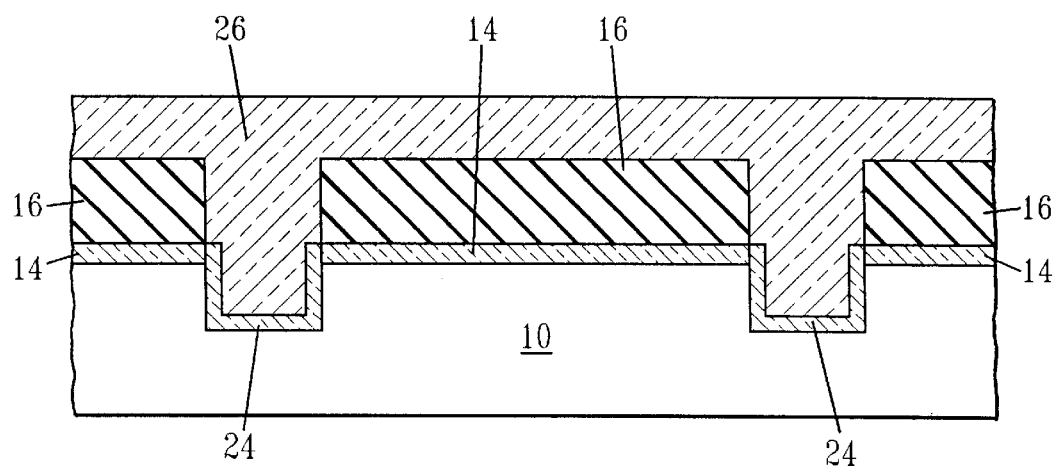

After the resist has been removed from the structure of FIG. 2, an oxide liner 24 is formed in the isolation trenches below the nitride layer utilizing conventional deposition or thermal growing techniques well known to those skilled in the art so as to line the sidewalls and the bottom of each trench and then each trench is filled with trench dielectric 26 such as tetraethylorthosilicate (TEOS) $SiO_2$ or a flowable oxide also utilizing conventional deposition processes well known to those skilled in the art. FIG. 3 shows the above steps of forming a liner and filling the trench opening with a trench dielectric material. When TEOS is employed as the trench dielectric material, an optional densification step may be employed prior to planarization.

Figure 4:
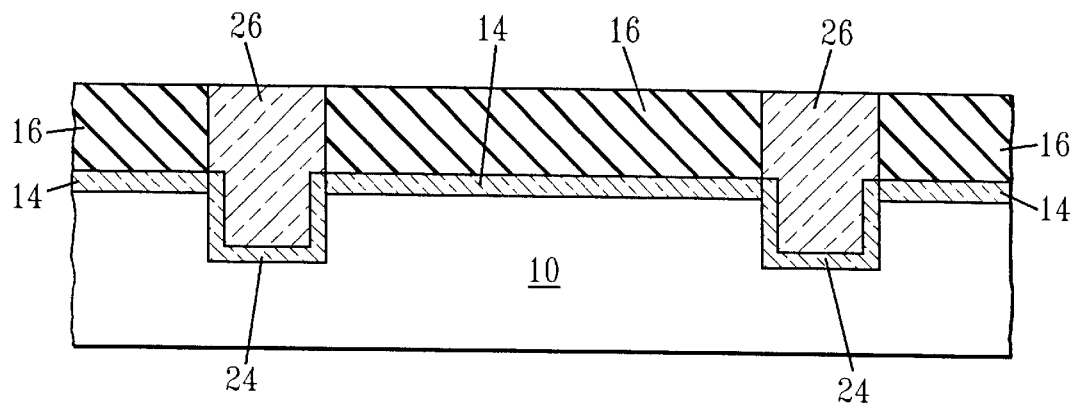

It is noted that the deposition process used in filling the trench opening also forms a trench dielectric material on the surface of nitride layer 16. FIG. 4 shows the structure after conducting a conventional planarization process such as chemical-mechanical polishing (CMP) which stops on nitride layer 16.

Figure 5:
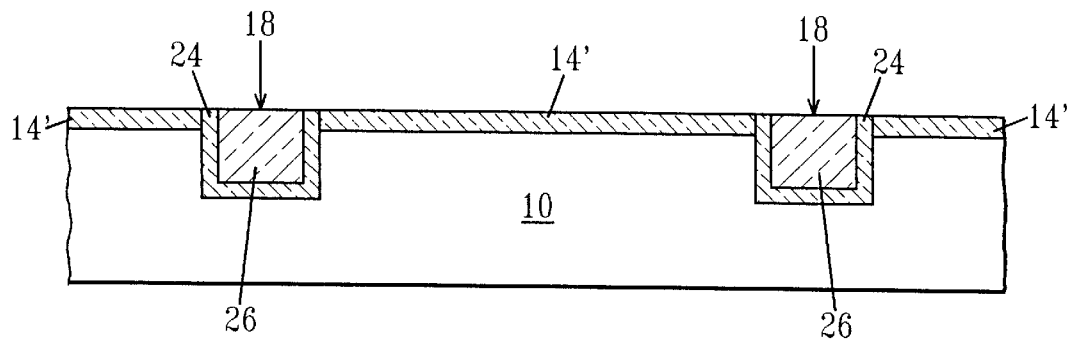

FIG. 5 provides an illustration of the structure after removing both nitride layer 16 and sacrificial pad oxide layer 14 and forming a new pad oxide layer 14' on the surface on the substrate that does not include the trench dielectric. It is noted that liner 24 and trench dielectric 26 form isolation trench region 18 in the substrate. The nitride and pad oxide layer may be removed utilizing individual etching processes that are selective for removing each individual layer separately, or alternatively, the layers may be removed utilizing a chemical etching process that is selective in removing both layers at the same time.

Insofar as the new pad oxide layer (14') is concerned, that new oxide layer may be formed utilizing the same or different thermal growing or deposition process as used in forming the previous pad oxide layer. The thickness of new pad oxide layer 14' is from about 50 to about 200 Å.

Figure 6:
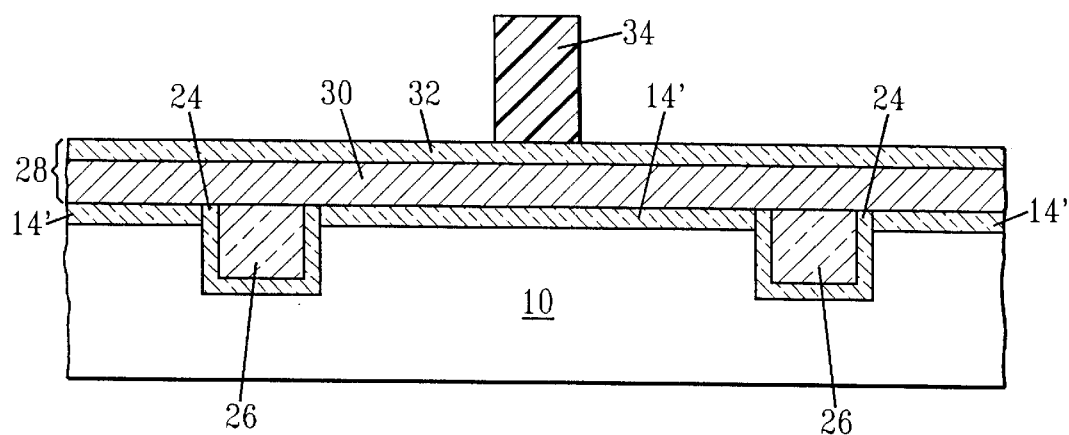

FIG. 6 illustrates the processing steps that are used in forming the dummy gate region in the structure. Specifically, a dummy gate film stack 28 comprising polysilicon layer 30 and top oxide layer 32 is formed on the structure of FIG. 5, i.e., on oxide layer 14'. The polysilicon layer of dummy film stack 28 is formed utilizing conventional deposition processes such as CVD, plasma-assisted CVD and sputtering, with a low pressure CVD process being highly preferred. The thickness of polysilicon layer 30 is not critical to the present invention, but typically the thickness of the polysilicon layer is from about 1000 to about 2000 Å.

The oxide layer of dummy film stack 28 is formed utilizing ozone deposition of tetraethylorthosilicate (TEOS), or any other deposition process which is capable of forming an oxide layer. The thickness of oxide layer 32 is not critical to the present invention, but typically the thickness of the oxide layer is from about 300 to about 500 Å. It is noted that oxide layer 14' serves as the bottom oxide of the dummy gate region and oxide layer 32 serves as the top oxide layer of the dummy gate region.

FIG. 6 also shows the presence of patterned resist 34 which is used in fabricating a dummy gate region in dummy film stack 28. The resist employed in the present invention is any conventional resist used in lithography and it is formed on the oxide layer utilizing conventional deposition processes, exposure and development.

The patterned resist is used in the present invention to protect a portion of dummy film stack 28. The unprotected areas of dummy film stack 28 are removed stopping on pad oxide layer 14' utilizing a conventional dry etching process such as RIE or plasma etching. After removing the unprotected layers, i.e., polysilicon layer 30 and oxide layer 32 of the dummy film stack, the patterned resist is stripped utilizing conventional stripping techniques well known to those skilled in the art.

Figure 7:
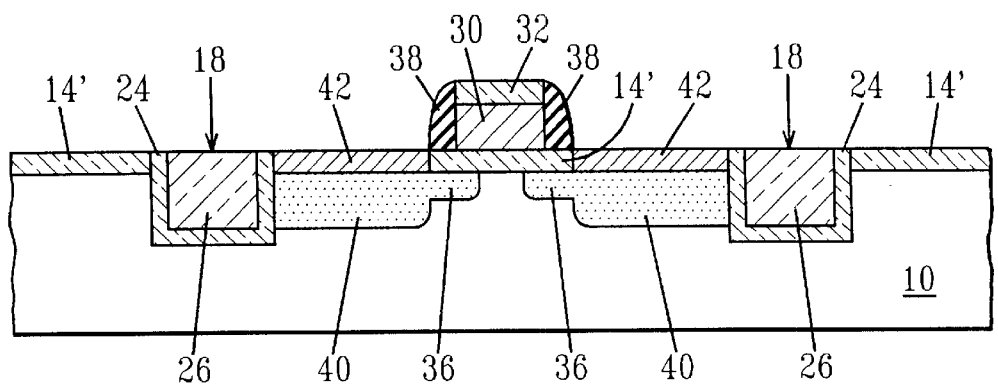

After removing the patterned resist from the dummy gate region, source/drain extensions 36, spacers 38, source/drain regions 40, and silicide regions 42 (over the source/drain regions and on top of the polysilicon of the dummy gate) are formed providing the structure shown in FIG. 7. It is noted that FIG. 7 illustrates a structure which includes a dummy gate region which comprises polysilicon layer 30 sandwiched between bottom oxide 14' and top oxide 32.

The source/drain extensions are formed utilizing conventional ion implantation and annealing. The annealing temperature used in activating the source/drain extensions is typically about 950° C. or above, and the annealing time is typically about 5 seconds or below.

Spacers 38 are composed of any conventional nitride (e.g., $Si_3N_4$) or oxide/nitride and are formed utilizing conventional deposition processes well known in the art and then they are etched by RIE or another like etch process. The thickness of spacers 38 may vary, but typically they have a thickness of from about 100 to about 150 nm.

Source/drain regions 40 are formed by conventional ion implantation and annealing. The anneal temperature used in activating the source/drain regions is typically about 1000° C. or above, for a time period of about 5 seconds or less.

Figure 8:
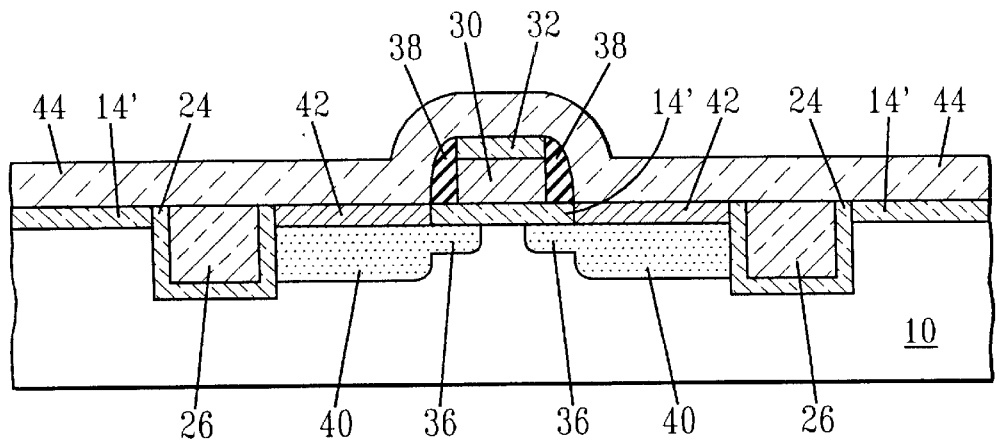

Silicide regions 42 are formed in the structure utilizing conventional silicide processing steps that are well known to those skilled in the art. Since such processing steps are well known, a detailed description of the same is not provided herein. It is noted that the silicide regions are formed over the source and drain regions but not on the gate region. This is because the polygate region is covered by oxide 32 during silicidation. Next, as shown in FIG. 8, an insulator layer 44 is formed over the structure utilizing conventional deposition processes such as CVD, low pressure CVD, plasma-assisted CVD and other like deposition processes that are capable of forming a conformal layer over the structure. Any insulator material such as $SiO_2$ can be employed as layer 44. The thickness of the insulator layer may vary depending upon the type of material used, but typically the thickness of the insulator layer is from about 2000 to about 3000 Å.

Figure 9:
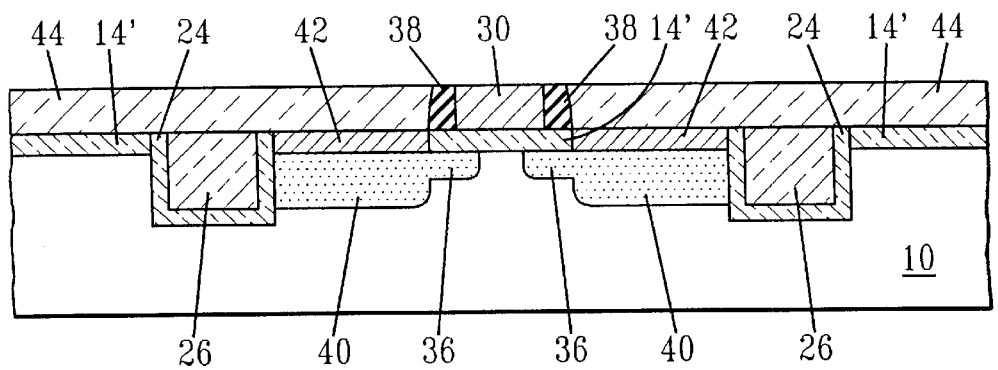

After forming the insulator layer over the structure, any conventional planarization process such as chemical-mechanical polishing or grinding may be employed. It is noted that the planarization process employed in this step of the present invention is stopped after top oxide layer 32 of the dummy gate region is removed. Thus, the planarization exposes polysilicon layer 30 of the dummy gate region. The structure formed after conducting the above planarization step is shown in FIG. 9.

Figure 10:
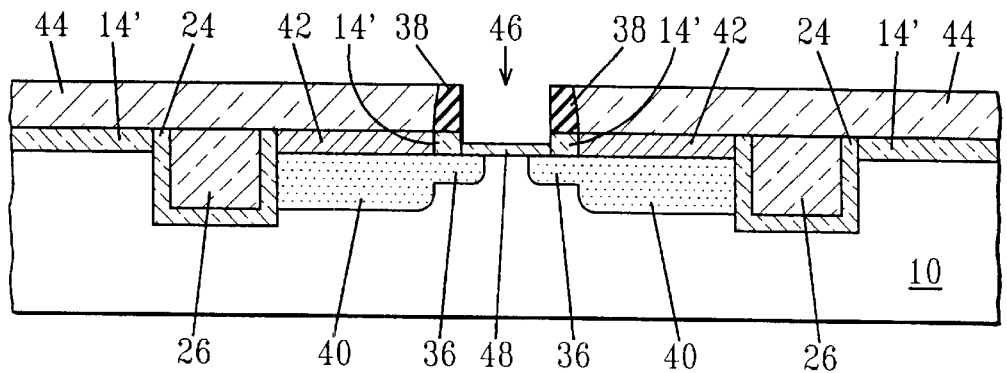

Next, polysilicon layer 30 of the dummy gate region is removed utilizing RIE or a chemical down stream etching process exposing pad oxide layer 14'. The exposed pad oxide is then etched utilizing a COR process stopping on the surface of substrate 10, See FIG. 10. The combined etching steps form gate opening 46 in the structure. The COR step comprises a vapor phase chemical oxide removal process in which a vapor of HF and $NH_3$ is employed as an etchant gas and low pressures (6 millitorr or below) are used.

In one embodiment of the present invention, the dummy gate shown in FIG. 6 is comprised of polysilicon that is heavily doped with an N+ dopant. When heavily doped N+ polysilicon is employed as the dummy gate stack it is removed using a chemical wet etch process such as KOH.

After forming the gate opening in the structure, any gate dielectric 48 including high-temperature dielectrics and high-temperature sensitive dielectrics is formed in the opening utilizing a conventional deposition or growth process. The thickness of gate dielectric 48 is from about 5 to about 30 Å. Examples of suitable gate dielectrics that can be employed in the present invention include: $N_2O$, NO, $SiO_2$, $ZrO_2$, barium titanate, strontium titanate, barium strontium titanate and the like.

An optional liner 50, e.g., a nitride, may then be formed in the gate opening so as to line the sidewalls of the opening as well as the top surface of the gate dielectric. The optional liner may be formed in the structure utilizing any conventional deposition process such as CVD and the thickness may vary depending on the type of material used in forming the liner. It should be emphasized that although the drawings depict the presence of the optional liner, the present invention works when no liner is formed in the opening.

A conductive material 52 such as polysilicon, W, Ta, or TiN is then formed in the opening utilizing conventional deposition processes including, but not limited to: CVD, plasma-assisted CVD, sputtering, plating, evaporation and other like deposition processes. The structure may then be planarized by conventional planarization processes, e.g., CMP, to provide the structure shown in FIG. 11.

It should be noted that when the conductive material is polysilicon, the polysilicon may be formed by either an in-situ doping deposition process or deposition, ion implantation and annealing. The in-situ doping deposition process is employed when the gate dielectric cannot withstand high temperature annealing, whereas ion implantation and annealing are employed when the gate dielectric is a material that can withstand such high temperature annealing. It should again be emphasized that when high temperature annealing is employed no agglomerization of the silicide regions occurs because the silicide region is capped with an insulator.

Figure 12:
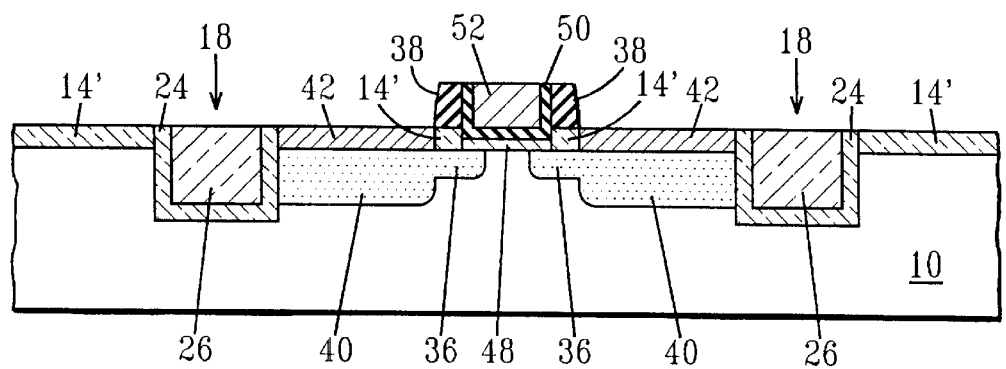

FIG. 12 shows the final structure obtained in the present invention after a conventional etch to remove layer 44 has been employed. The structure shown in FIG. 12 may then be subjected to other conventional CMOS processing steps which are well known in the art and are described, for example, in R. Colclaser, "Micro Electronics Processing and Device Design, Chapter 10, pages 266–269, John-Wily and Sons publisher, 1980.

Figure 11:
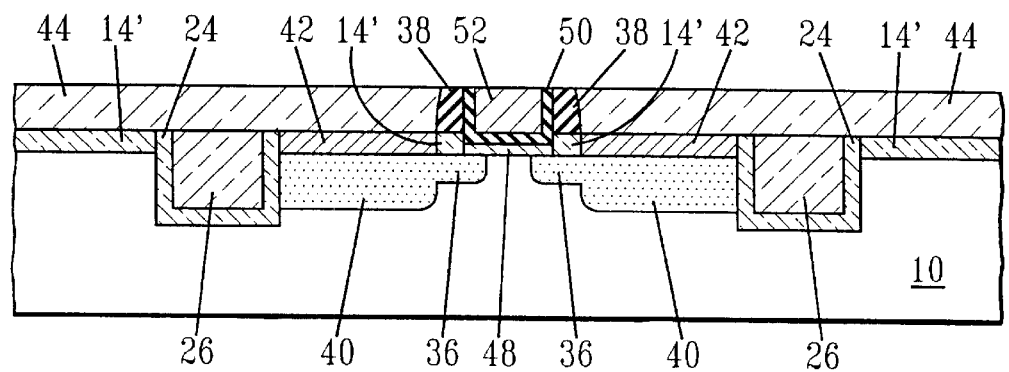
Figure 13:
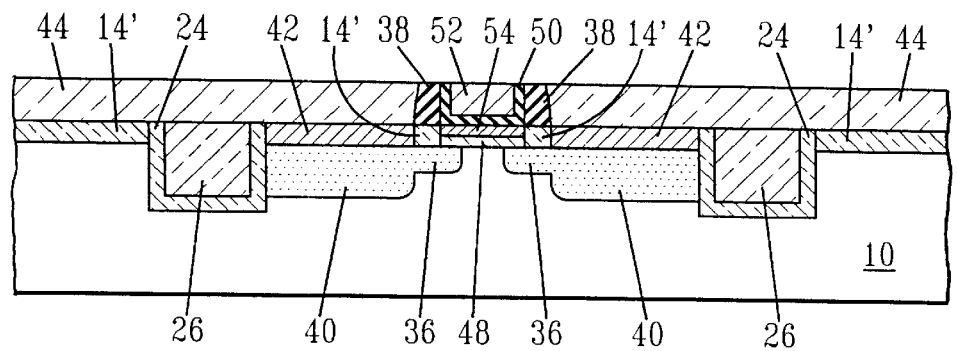
FIGS. 13–14 are pictorial representations of a high-performance sub-0.1 µm MOSFET device through an alternative embodiment of the present invention.

In an alternative embodiment of the present invention, the gate region further includes recessed polysilicon layer 54 that is formed on the gate dielectric of the structure shown FIG. 11 prior to forming the conductive material in the opening, or alternatively the optional liner material in the opening. This embodiment of the present invention which includes the processing steps used in forming the structure shown in FIG. 11 will now be described with reference to FIGS. 13–14. Specifically, a layer of polysilicon 54 is formed in the opening shown in FIG. 11 on the gate dielectric 48. This layer of polysilicon may be formed by first completely filling the opening with polysilicon using an in-situ doping deposition process which includes a doping concentration of greater than $1E20/cm^3$, CMP the doped polysilicon, and recessing the doped polysilicon in the gate opening so as to provide recessed polysilicon layer 54, See FIG. 13.

Figure 14:
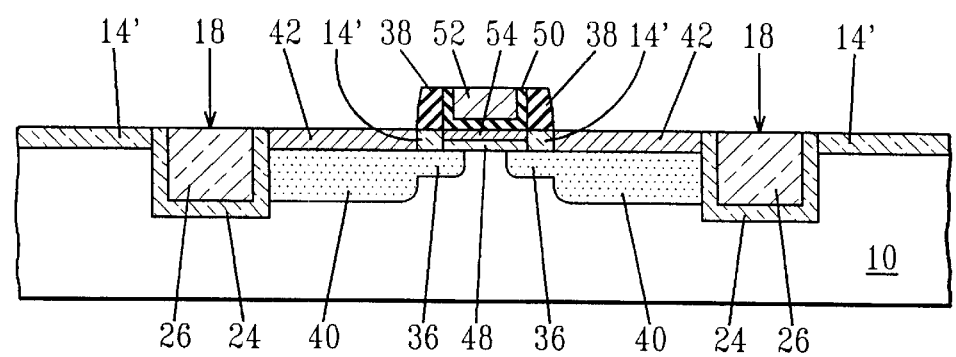

Optional liner 50 and/or conductive material 52 are then formed in the opening as described above providing the structure shown in FIG. 13. FIG. 14 shows the structure after etching insulator layer 44.

In addition to employing the in-situ doping deposition process mentioned above, the recessed polysilicon layer may be formed by first depositing intrinsic polysilicon in the gate opening on the gate dielectric; ion implanting the polysilicon with an appropriate dopant; activating the doped polysilicon; recessing the doped polysilicon and then conducting the above described processing steps.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A process of fabricating a sub-0.1 μm MOSFET device having minimum poly depletion, silicided source and drain junctions and very low sheet resistance poly-gates comprising the steps of:
   (a) providing a dummy gate region on a surface of a semiconductor substrate, said dummy gate region including polysilicon sandwiched between a bottom oxide layer and a top oxide layer;
   (b) forming activated source and drain regions in said semiconductor substrate using said dummy gate region as an implantation mask;
   (c) siliciding the surface of said semiconductor substrate overlying said activated source and drain regions;
   (d) forming an insulator layer on said surface of said semiconductor substrate, said insulator layer also surrounding said dummy gate region;
   (e) planarizing said insulator layer so as to remove said top oxide layer of said dummy gate region thus exposing said polysilicon;
   (f) selectively removing said polysilicon and said bottom oxide layer of said dummy gate region so as to provide an opening which exposes a portion of said semiconductor substrate;
   (g) forming a gate dielectric on said exposed portion of said semiconductor substrate;
   (h) depositing a gate conductor on said gate dielectric; and
   (i) etching said insulator layer formed in step (d).

2. The process of claim 1 further comprising forming a recessed polysilicon layer on said gate dielectric prior to step (h).

3. The process of claim 2 wherein said recessed polysilicon is formed by completely filling said opening with polysilicon utilizing an in-situ doping deposition process, planarizing the activated polysilicon, and etching said planarized polysilicon below said opening.

4. The process of claim 2 wherein said recessed polysilicon is formed by depositing intrinsic polysilicon in said opening, doping said intrinsic polysilicon by ion implantation, activating annealing said doped polysilicon, planarizing the doped polysilicon, and etching said planarized doped polysilicon below said opening.

5. The process of claim 1 wherein said dummy gate region is formed by providing a patterned resist to a surface of a dummy gate stack and removing portions of said dummy gate stack not covered by said pattern resist.

6. The process of claim 5 wherein said dummy gate stack includes a layer of polysilicon and a top oxide layer formed on said bottom oxide layer.

7. The process of claim 1 wherein prior to forming activated source and drain regions in said substrate, source and drain extensions are formed in the substrate.

8. The process of claim 7 further comprising forming spacers about said polysilicon and top oxide layer of said dummy gate stack.

9. The process of claim 7 wherein said source and drain extensions are formed by ion implantation and annealing at a temperature of about 950° C. or above for a time period of about 5 seconds or less.

10. The process of claim 1 wherein said activated source and drain regions are formed by ion implantation and activating annealing at a temperature of about 1000° C. or above for a time period of about 5 seconds or less.

11. The process of claim 1 wherein step (f) includes reactive ion etching or chemical down stream etching to remove said polysilicon layer and vapor phase chemical oxide removal (COR) process to remove said bottom oxide layer.

12. The process of claim 11 wherein said COR process includes a vapor of HF and $NH_3$ and pressures below 6 millitorr.

13. The process of claim 1 wherein said diffusion barrier layer employed in step (h) is composed of a nitride material.

14. The process of claim 1 wherein said conductive material is composed of polysilicon, W, Ta or TiN.

15. The process of claim 1 wherein said substrate includes isolation regions formed therein.

16. The process of claim 1 wherein said gate dielectric employed in step (g) is composed of $N_2O$, NO, $SiO_2$, $ZrO_2$, barium titanate, strontium titanate or barium strontium titanate.

17. The method of claim 1 wherein said dummy gate region is comprised of heavily-doped N+ polysilicon, and KOH is employed in removing the same in step (f).

18. The method of claim 14 wherein said polysilicon is in-situ doped polysilicon.

19. The method of claim 14 wherein said polysilicon is intrinsic polysilicon which is doped via ion implantation and activating by annealing.

20. The method of claim 1 wherein an optional liner is formed on said gate dielectric and said opening prior to depositing said conductive material.

* * * * *